United States Patent
Chou et al.

(10) Patent No.: US 10,126,210 B2
(45) Date of Patent: Nov. 13, 2018

(54) FAULT DETECTION AND CLASSIFICATION MATCHING

(71) Applicant: TAIWAN SEMICONDUCTOR MANUFACTURING CO., LTD., Hsinchu (TW)

(72) Inventors: Chia-Jen Chou, Taipei (TW); Yu-Jhen Liu, Zhubei (TW); Yi-Ting Tsai, Zhubei (TW); Jo-Ling Pan, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 168 days.

(21) Appl. No.: 15/153,533

(22) Filed: May 12, 2016

(65) Prior Publication Data
US 2017/0030807 A1 Feb. 2, 2017

Related U.S. Application Data

(60) Provisional application No. 62/198,523, filed on Jul. 29, 2015.

(51) Int. Cl.
G06F 19/00 (2018.01)
G01M 99/00 (2011.01)
H01L 21/67 (2006.01)
H01L 21/66 (2006.01)

(52) U.S. Cl.
CPC ...... *G01M 99/008* (2013.01); *H01L 21/67155* (2013.01); *H01L 21/67288* (2013.01); *H01L 22/10* (2013.01)

(58) Field of Classification Search
CPC ...... H01L 2224/48091; B01L 2300/021; B01L 2300/0645
USPC ......................................... 702/182–185, 188
See application file for complete search history.

(56) References Cited

U.S. PATENT DOCUMENTS

| | | | | |
|---|---|---|---|---|
| 7,356,377 B2 * | 4/2008 | Schwarm | ........... | G05B 23/0294 700/108 |
| 2004/0143403 A1 * | 7/2004 | Brandon | ........... | G06F 19/24 702/19 |

* cited by examiner

*Primary Examiner* — Edward Raymond
(74) *Attorney, Agent, or Firm* — Maschoff Brennan (57) ABSTRACT

Raw data from chambers is received. Based on received raw data, if a fault exists in operations of the chambers is detected. The detecting includes at least one of operations outlined below. Sigma values respectively corresponding to the chambers are generated based on the raw data of the chambers. A determination is made to determine whether a sigma ratio corresponding to the sigma values is smaller than a threshold value. Mean outlier indexes respectively corresponding to the chambers is generated by executing a mean matching process for the chambers in a condition that the sigma ratio is smaller than the threshold value. One of the chambers, which has a worst first mean outlier index of the first mean outlier indexes, is identified as a target chamber having fault operation.

20 Claims, 4 Drawing Sheets

FAULT DETECTION AND CLASSIFICATION MATCHING

PRIORITY CLAIM AND CROSS-REFERENCE

This application claims priority to U.S. Provisional Application Ser. No. 62/198,523, filed Jul. 29, 2015, which is herein incorporated by reference.

BACKGROUND

In semiconductor manufacturing, various processes including etching, deposition, implantation, and annealing, are performed with various processing tools. For example, a sputtering tool is designed to perform a sputtering deposition. Furthermore, various processing tools of the same type are each typically designed to perform a corresponding process, such as sputtering deposition. Typically, the processing tools are configured such that the processing deviations among the processing tools are within a certain tolerable range.

Traditionally, fault detection and classification (FDC) matching between different tools is identified by user knowledge. For example, the user determines an abnormal situation on a FDC chart by his experience and knowledge rather than a standard criterion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
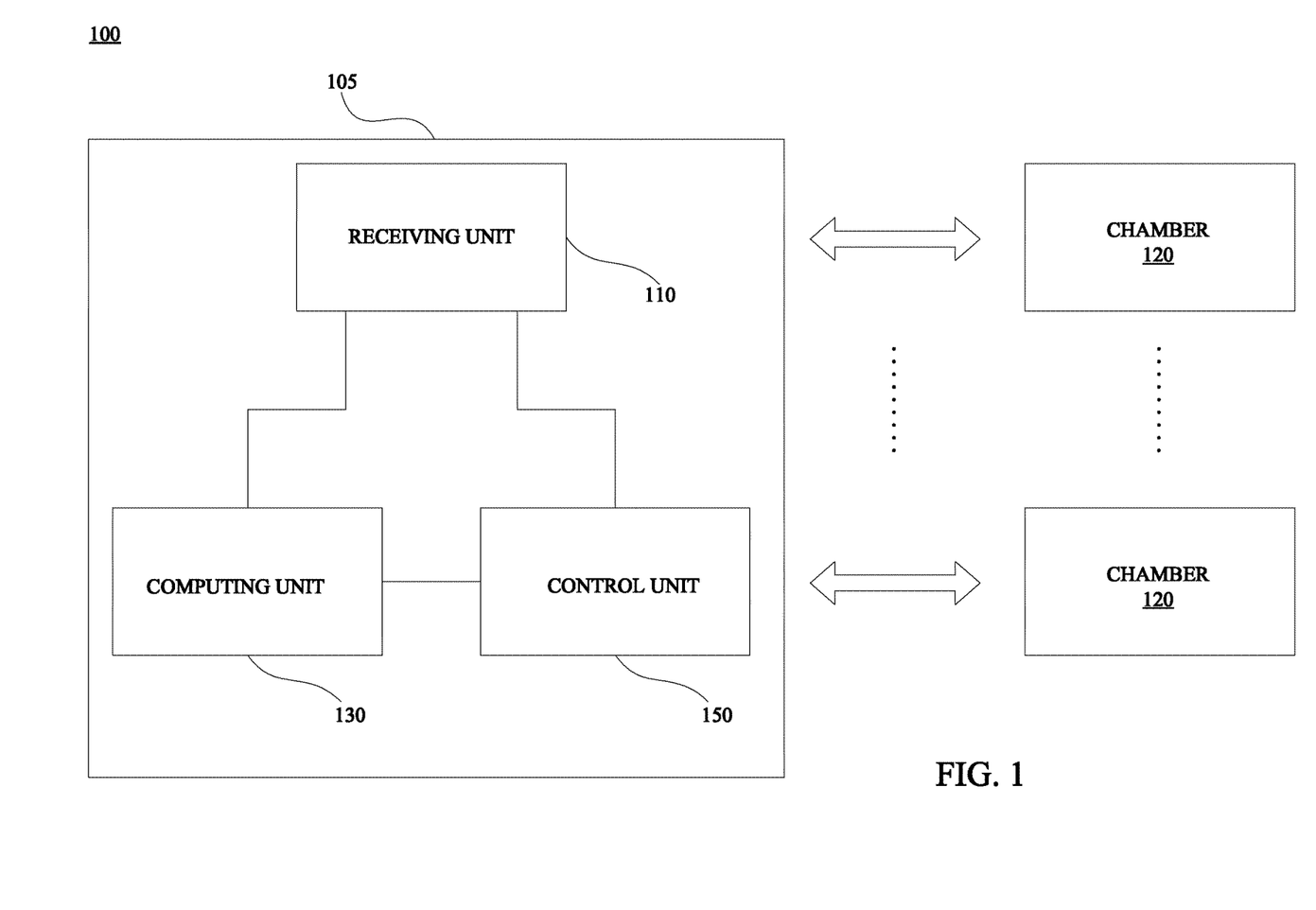
FIG. 1 is a schematic diagram of a fault detection and classification system in accordance with various embodiments of the present disclosure.

FIG. 1 is a schematic diagram of a fault detection and classification (FDC) system 100 in accordance with various embodiments of the present disclosure. In the fault detection and classification system 100, a host device 105 is configured to analyze raw data from chambers 120. The raw data includes parameters including, for example, temperature, air pressure, air type, etc. Moreover, the host device 105 is configured to identify a target chamber among the chambers 120 in accordance with the analysis result. In some embodiments, the target chamber is a chamber that has fault operation. For illustration, the target chamber has FDC mismatching parameters including, for example, incorrect pressure, temperature, process time, etc., which will be explained below.

In some embodiments, the fault detection and classification system 100 is implemented in a semiconductor manufacturing environment to handle relatively large amounts of real-time data and delayed data. In the semiconductor manufacturing environment, the fault detection and classification system 100 is a semiconductor manufacturing FDC system, and the host device 105 analyzes raw data from semiconductor manufacturing chambers.

As illustratively shown in FIG. 1, the host device 105 is configured to receive raw data (e.g., temperature, air pressure, etc.) from the chambers 120, and detect if a fault exists in operations of the chambers 120 based on the received raw data of the chambers 120. In some embodiments, the host device 105 is implemented by a computer which includes, for example, a central process unit, a control unit, a microprocessor, or the equivalents. In some other embodiments, the fault detection and classification system 100 supports an automatic fault detection and classification. In further embodiments, the host device 105 is configured to automatically implement a remedy to correct the fault detected in the target chamber.

In some embodiments, the host device 105 includes a receiving unit 110, a computing unit 130 and a control unit 150. The receiving unit 110 is configured to receive raw data (e.g., temperature, air pressure, etc.) of each of the chambers 120.

The computing unit 130 is configured to execute mathematical algorithm. In some embodiments, the computing unit 130 is configured to calculate a standard deviation for the raw data of each of the chambers 120, to generate a plurality of sigma values corresponding to the chambers 120. In some other embodiments, the computing unit 130 is configured to calculate a mean value for the raw data of each of the chambers 120.

The control unit 150 is configured to identify a target chamber among the chambers 120, by analyzing variances and relevance between the raw data of the chambers 120. In some embodiments, the control unit 150 is configured to identify a target chamber by determining a number of the chambers 120, checking a sigma ratio corresponding to sigma values of the chambers 120, executing a sigma matching process and a mean matching process for the raw data of the chambers 120. Detail operations are described below with reference to FIG. 2A and FIG. 2B. In some embodiments, the host device 105 performs the operations as illustrated in FIG. 2A and FIG. 2B.

Figure 2A:
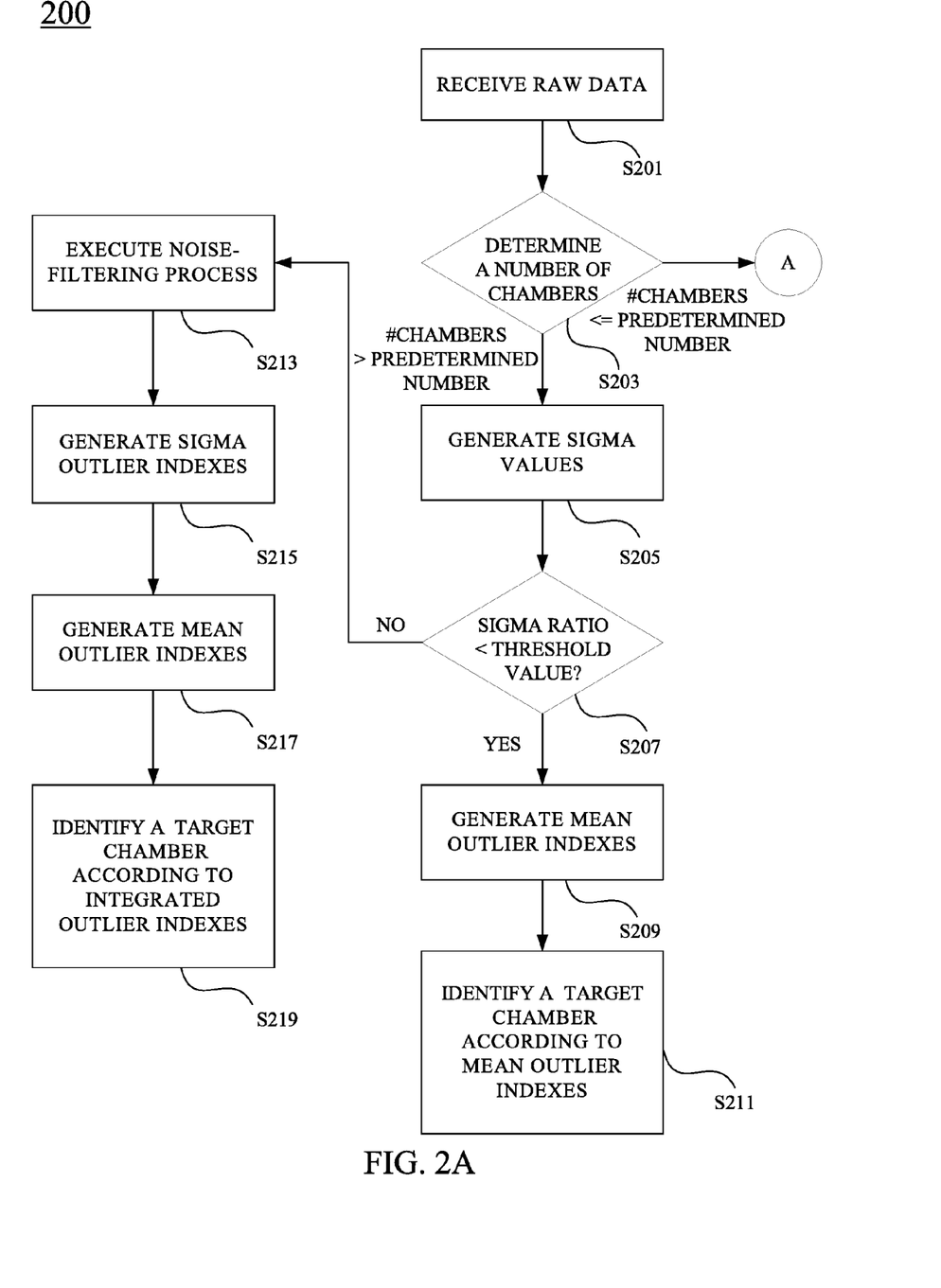
FIG. 2A and FIG. 2B are each a flow chart of a fault detection and classification method related to the system in FIG. 1, in accordance with various embodiments of the present disclosure.
Figure 2B:
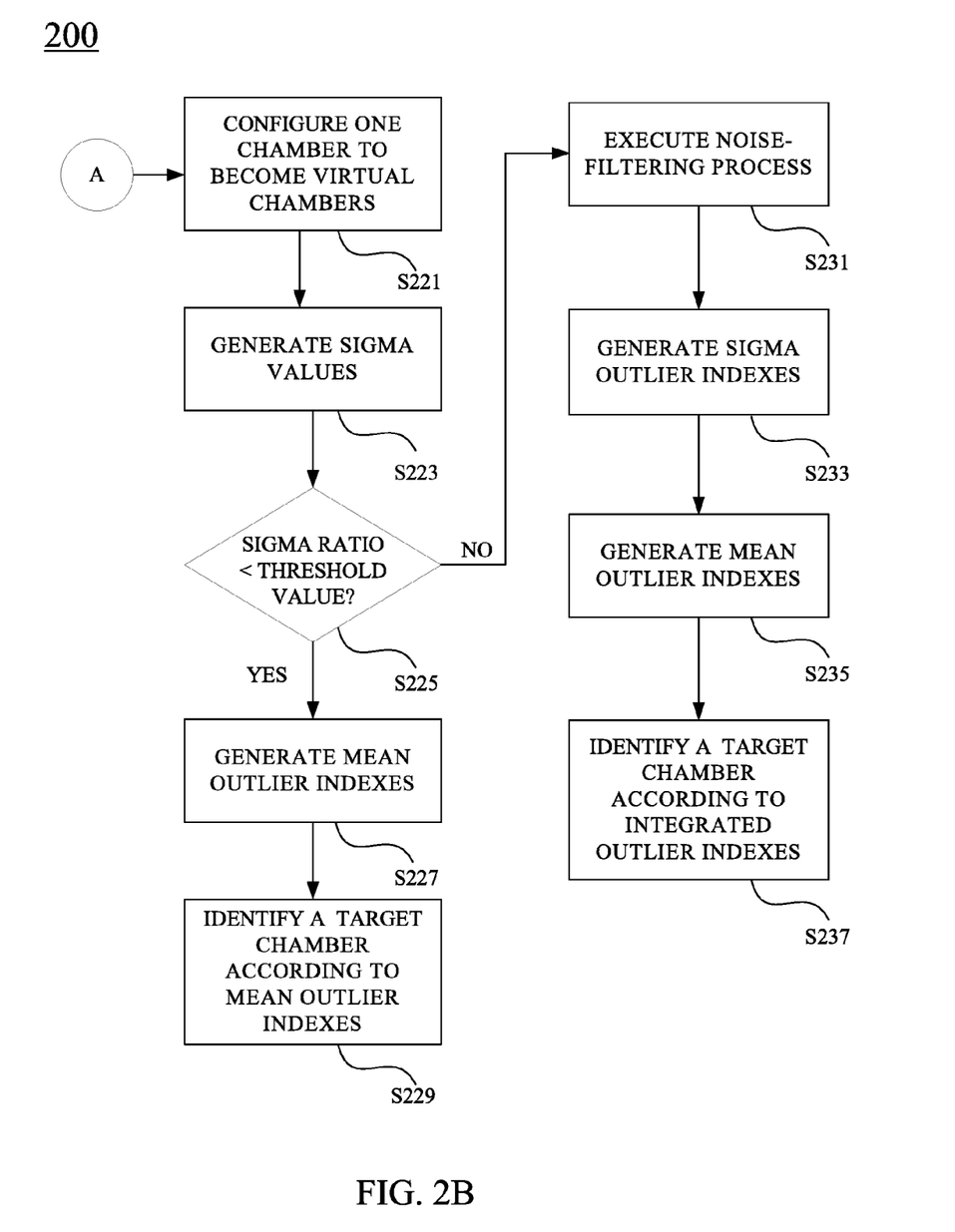

Reference is made to FIG. 1, FIG. 2A and FIG. 2B. FIG. 2A and FIG. 2B are each a flow chart of a fault detection and classification method related to the system 100 in FIG. 1, in accordance with various embodiments of the present disclosure.

In some embodiments, the receiving unit 110, the computing unit 130 and the control unit 150 take the form of a computer program product stored on a non-transitory computer-readable storage medium having computer-readable instructions embodied in the medium. In some other embodiments, the fault detection and classification method 200 take the form of a computer program product stored on a non-transitory computer-readable storage medium having computer-readable instructions embodied in the medium. Any suitable non-transitory storage medium may be used and include non-volatile memory such as read only memory (ROM), programmable read only memory (PROM), erasable programmable read only memory (EPROM), and electrically erasable programmable read only memory (EEPROM) devices; volatile memory such as static random access memory (SRAM), dynamic random access memory (DRAM), and double data rate random access memory (DDR-RAM); optical storage devices such as compact disc read only memories (CD-ROMs) and digital versatile disc read only memories (DVD-ROMs); and magnetic storage devices such as hard disk drives (HDD) and floppy disk drives.

In some embodiments, the host device 105 in FIG. 1 performs operations as illustrated in FIG. 2A and FIG. 2B. For illustration, the host device 105 performs operations including operation S201, to receive the raw data from the chambers 120. The host device 105 then performs operations including operations S203-S237, to detect if a fault exists in operations of the chambers 120 based on the received raw data of the chambers 120. Detail operations are described below with reference to FIG. 1, FIG. 2A and FIG. 2B.

As illustratively shown in FIG. 1 and FIG. 2A, in operation S201, the raw data of the chambers 120 are received by the receiving unit 110. In operation S203, a number of chambers 120 is determined by the control unit 150. In a condition that the number of the chambers 120 is larger than a predetermined number, operations S205-S219 are executed. On the other hand, in a condition that the number of the chambers 120 is equal to or less than the predetermined number, operations S221-S237 as illustrated in FIG. 2B are executed. In the condition that the number of the chambers 120 is equal to or less than the predetermined number, one of the chambers 120 is able to be effectively selected and configured to become virtual chambers for further operations including, for example, operations S221-S237. In some embodiments, the predetermined number is configured as two. However, the predetermined number discussed above is given for illustrative purposes. Various predetermined numbers are within the contemplated scope of the present disclosure.

Figure 3:
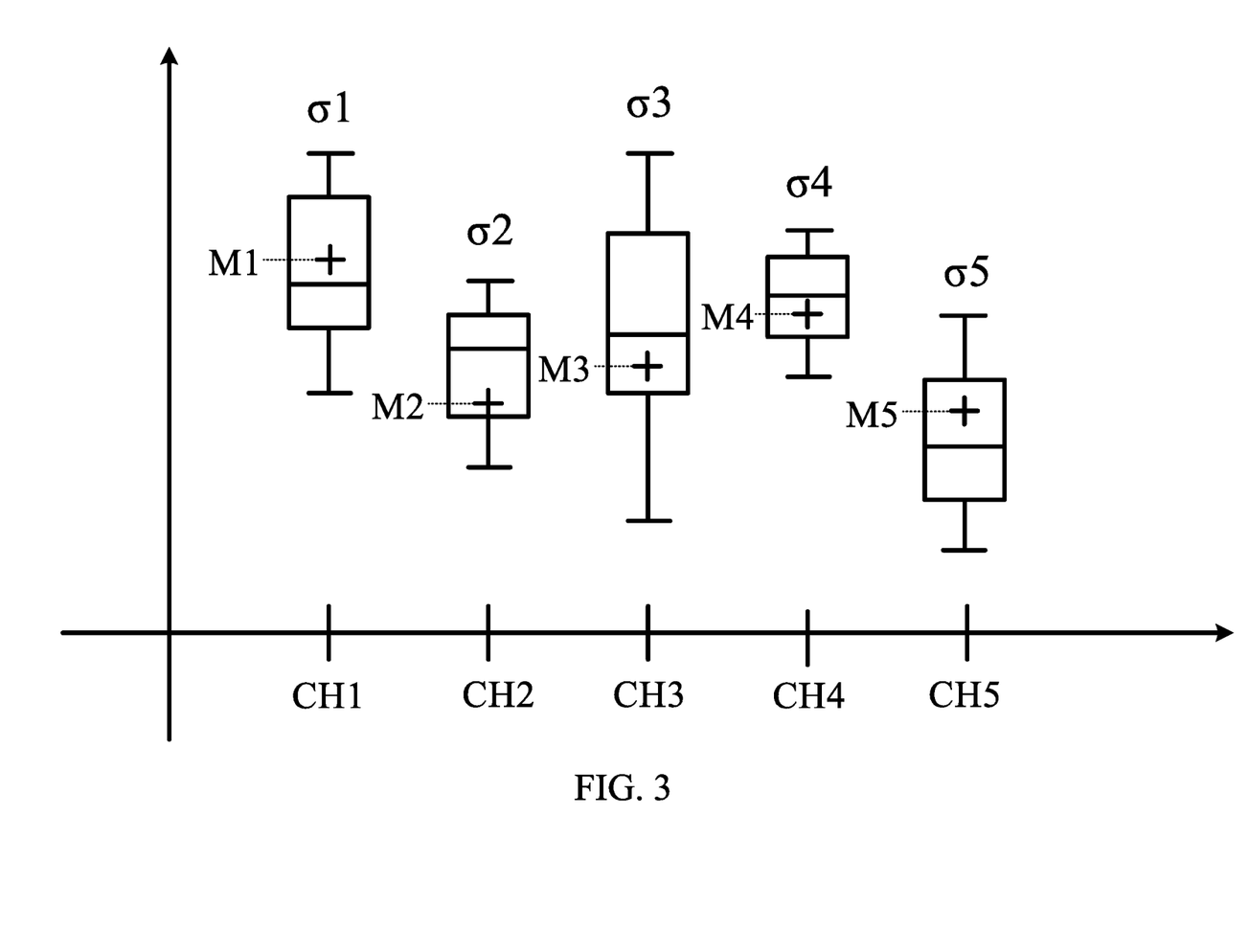
FIG. 3 is a box-and-whisker plot illustrating sigma values and mean values, which correspond to raw data of five chambers and are associated with the method in FIG. 2A and FIG. 2B, in accordance with various embodiments of the present disclosure.

As described above in operation S203, if the number of the chambers 120 is larger than the predetermined number, operations S205-S219 are executed. Operations S205-S219 are described with reference to FIG. 3. FIG. 3 is a box-and-whisker plot illustrating sigma values and mean values, which correspond to raw data of five chambers CH1-CH5 and are associated with the method in FIG. 2A and FIG. 2B, in accordance with various embodiments of the present disclosure. For illustration in FIG. 3, the sigma values $\sigma 1$-$\sigma 5$ represent standard deviations corresponding to the raw data of the chambers CH1-CH5, respectively. For simplicity, five chambers CH1-CH5 are illustrated in FIG. 3, but the present disclosure is not limited in this regard. Alternatively stated, various numbers of the chambers (larger than a predetermined number) in regard to the sigma values and the mean values illustrated in FIG. 3 are within the contemplated scope of the present disclosure.

With reference to FIG. 1, FIG. 2A and FIG. 3, in operation S205, the sigma values $\sigma 1$-$\sigma 5$ respectively corresponding to the chambers CH1-CH5 are generated by the computing unit 130 based on the raw data of the chambers CH1-CH5. In some embodiments, the computing unit 130 calculates a standard deviation for the raw data of the each of the chambers CH1-CH5, in order to generate the sigma values $\sigma 1$-$\sigma 5$ corresponding to the chambers CH1-CH5, respectively. For illustration, the sigma value $\sigma 1$ represents a distribution of the raw data of the chamber CH1, the sigma value $\sigma 2$ represents a distribution of the raw data of the chamber CH2, and so on.

In operation S207, a determination is made by the control unit 150 to determine whether a sigma ratio corresponding to the sigma values $\sigma 1$-$\sigma 5$ is smaller than a threshold value. In some embodiments, the sigma ratio is a ratio of the square of a largest sigma value among the sigma values $\sigma 1$-$\sigma 5$, to the square of a smallest sigma value among the sigma values $\sigma 1$-$\sigma 5$. For illustration in FIG. 3, the sigma value $\sigma 3$ of the chamber CH3 is larger than the sigma values $\sigma 1$-$\sigma 2$ and $\sigma 4$-$\sigma 5$, and the sigma value $\sigma 4$ of the chamber CH4 is smaller than the sigma values $\sigma 1$-$\sigma 3$ and $\sigma 5$. Therefore, the control unit 150 generates a ratio of the square of the sigma value $\sigma 3$ to the square of the sigma value $\sigma 4$, as the sigma ratio.

In some embodiments, the square of the sigma value is defined as a pooled variance. Alternatively stated, the sigma ratio is also defined, in some embodiments, as a ratio of a largest pooled variance to a smallest pooled variance among the pooled variances of the chambers.

In some embodiments, a condition that the sigma ratio is smaller than the threshold value represents that fluctuation of the raw data is small. In such a condition, there is approximately no noise existing in the raw data of each of the chambers. Therefore, the sigma matching process used for identifying the fluctuation of the raw data of the chambers is skipped in the condition that the sigma ratio is smaller than the threshold value.

In the condition that the sigma ratio is smaller than the threshold value, operation S209 is executed. In operation S209, a plurality of mean outlier indexes $OI_{mean1}1$-$OI_{mean1}5$ respectively corresponding to the chambers CH1-CH5 is generated by the control unit 150, by executing a mean matching process for the chambers CH1-CH5. In some embodiments, "outlier index" indicates the measurement in which the data point deviates from the behavior of the remainder of data stream.

In some embodiments, the mean matching process includes the operations outlined below. A mean value for the raw data of each of the chambers CH1-CH5 is calculated by the computing unit 130. Next, each mean value of the chambers is compared with the other mean values by the control unit 150, in order to generate the mean outlier indexes $OI_{mean1}1$-$OI_{mean1}5$ respectively corresponding to the chambers CH1-CH5.

For illustration in FIG. 3, mean values M1-M5 corresponding to the raw data of the chambers CH1-CH5 are calculated. With reference to FIG. 1 and FIG. 3, the control unit 150 compares the mean value M1 of the chamber CH1 with the mean values M2-M5 of the chambers CH2-CH5 to generate the mean outlier index $OI_{mean1}1$ of the chamber CH1. The control unit 150 compares the mean value M2 of the chamber CH2 with the mean values M1 and M3-M5 of the chambers CH1 and CH3-CH5 to generate the mean outlier index $OI_{mean1}2$ of the chamber CH2. The other mean outlier indexes are generated similar to those discussed above, and thus they are not further detailed herein.

In some embodiments, the mean outlier index (e.g., $OI_{mean1}1$) is a sum of absolute values of differences between one mean value (e.g., M1) and the other mean values (e.g., M2-M5). For illustration, the mean outlier index $OI_{mean1}1$ is a sum of an absolute value of a difference between the mean values M1 and M2, an absolute value of a difference between the mean values M1 and M3, an absolute value of a difference between the mean values M1 and M4, and an absolute value of a difference between the mean values M1 and M5.

In some embodiments, the mean matching process is used for identifying offsets of the raw data of the chambers. Alternatively stated, the mean outlier index of the chamber represents an offset of the raw data of the chamber compared with the raw data of other chambers. Therefore, the control unit 150 determines whether the chamber is a target chamber in accordance with the mean outlier index of the chamber.

In operation S211, the target chamber having fault operation is identified by the control unit 150 according to the mean outlier indexes $OI_{mean1}1$-$OI_{mean1}5$, in which the target chamber is a chamber having a worst mean outlier index among the chambers CH1-CH5. In some embodiments, the control unit 150 identifies the largest mean outlier index among the mean outlier indexes $OI_{mean1}1$-$OI_{mean1}5$, as the worst mean outlier index. Accordingly, the control unit 150 identifies the chamber having the largest mean outlier index, as the target chamber.

In some embodiments, the host device 105 displays a fault detection notification associated with the target chamber, on a display of the host device 105. In some other embodiments, the host device 105 controls the target chamber based on the fault detection result. In various embodiments, the host device 105 sends updated configuration data, based on the fault detection result, to the target chamber, to modify the operation of the target chamber.

In some other embodiments, the control unit 150 identifies the mean outlier index larger than a predetermined criterion, among the mean outlier indexes $OI_{mean1}1$-$OI_{mean1}5$, as the worst mean outlier index. Alternatively stated, the control unit 150 identifies the chamber having the mean outlier index larger than the predetermined criterion as the target chamber. The aforementioned ways to identify the target chamber are given for illustrative purposes. Various ways to identify the target chamber are within the contemplated scope of the present disclosure.

On the other hand, in a condition that the sigma ratio is larger than or equal to the threshold value, operation S213 is executed. In operation S213, a noise-filtering process is executed by the control unit 150 for the raw data of each of the chambers CH1-CH5. In some embodiments, the sigma ratio represents that the fluctuation between the chambers. Therefore, a condition that the sigma ratio is larger than or equal to the threshold represents that the fluctuation between the chambers is large.

In some embodiments, the noise-filtering process includes operations outlined below. At least one noise in each of the chambers CH1-CH5 is determined by the control unit 150, in which the noise indicates the raw data that has a value larger than a boundary value. Next, the noise (if existed) is filtered from the raw data of each of the chambers CH1-CH5.

For illustration, a few of the raw data have values that are larger than a boundary value, among all raw data, and most of the raw data have values that are smaller than the boundary value. The control unit 150 determines that the raw data having values which are larger than the boundary value as noises. The control unit 150 then filters the raw data having values which are larger than the boundary value, from the raw data of the chamber.

After the noise-filtering process is executed, operation S215 is executed. In operation S215, a plurality of sigma outlier indexes $OI_{sigma1}1$-$OI_{sigma1}5$ respectively corresponding to the chambers CH1-CH5 is generated by the control unit 150 by executing a sigma matching process for the chambers CH1-CH5.

In some embodiments, the sigma matching process includes the operations outlined below. A sigma value for the raw data of each of the chambers CH1-CH5 that have executed the noise-filtering process is generated by the computing unit 130. For illustration, the computing unit 130 calculates a standard deviation for the raw data in which the noise (if existed) has been filtered for each of the chambers CH1-Ch5, in order to generate sigma values σ1'-σ5' respectively corresponding to the chambers CH1-CH5. Next, each of the sigma values σ1'-σ5' is compared with the other sigma values by the control unit 150, in order to generate the sigma outlier indexes $OI_{sigma1}1$-$OI_{sigma1}5$ respectively corresponding to the chambers CH1-CH5.

Similarly, for illustration, the control unit 150 compares the sigma value σ1' of the chamber CH1 with the sigma values σ2'-σ5' of the chambers CH2-CH5 to generate the sigma outlier index $OI_{sigma1}1$, compares the sigma value σ2' of the chamber CH2 with the sigma values σ1' and σ3'-σ5' of the chambers CH1 and CH3-CH5 to generate the sigma outlier index $OI_{sigma1}2$, and so on.

In some embodiments, the sigma outlier index (e.g., $OI_{sigma1}1$) is a sum of absolute values of differences between one sigma value (e.g., σ1') and the other sigma values (e.g., σ2'-σ5'). For illustration, the sigma outlier index $OI_{sigma1}1$ is a sum of an absolute value of a difference between the sigma values σ1' and σ2', an absolute value of a difference between the sigma values σ1' and σ3', an absolute value of a difference between the sigma values σ1' and σ4', and an absolute value of a difference between the sigma values σ1' and σ5'.

In some embodiments, the sigma matching process is used for identifying fluctuation of the raw data of the chambers. Alternatively stated, the sigma outlier index of the chamber represents fluctuation of the raw data of the chamber compared with the raw data of other chambers. Therefore, the control unit 150 determines whether the chamber is a target chamber in accordance with the sigma outlier index of the chamber.

In operation S217, a plurality of mean outlier indexes $OI_{mean2}1$-$OI_{mean2}5$ respectively corresponding to the chambers CH1-CH5 are generated by the control unit 150 by executing the mean matching process for the chambers CH1-CH5. Similarly, in some embodiments, the mean matching process includes the operations outlined below. A mean value for the raw data of each of the chambers CH1-CH5 that has executed the noise-filtering process is generated by the computing unit 130. For illustration, the computing unit 130 calculates a mean value for the raw data in which the noise (if existed) has been filtered for each of the chambers CH1-Ch5, in order to generate mean values M1'-M5' respectively corresponding to the chambers CH1-CH5. Next, each of the mean values M1'-M5' is compared with the other mean values by the control unit 150, in order to generate the mean outlier indexes $OI_{mean2}1$-$OI_{mean2}5$ respectively corresponding to the chambers CH1-CH5. Operation S217 is similar to operation S209, and thus it is not further detailed herein.

In operation S219, a target chamber is identified by the control unit 150 according to integrated outlier indexes $OI_{in}1$-$OI_{in}5$, in which the target chamber is a chamber having a worst integrated outlier index among the chambers CH1-CH5. In some embodiments, the integrated outlier index (e.g., $OI_{in}1$) is a sum of the mean outlier index (e.g., $OI_{mean2}1$) and the sigma outlier index (e.g., $OI_{sigma2}1$). In some embodiments, the control unit 150 identifies the largest integrated outlier index (i.e., the largest sum of the mean outlier index and the sigma outlier index) as the worst integrated outlier index. Alternatively stated, the control unit 150 identifies that the chamber having the largest integrated outlier index is the target chamber. In some embodiments, the control unit 150 identifies the integrated outlier index larger than a predetermined criterion as the worst integrated outlier index. Alternatively stated, the control unit 150 identifies that the chamber having the integrated outlier index larger than the predetermined criterion is the target chamber.

In some embodiments, in the condition that the sigma ratio is larger than or equal to the threshold value, both the sigma matching and the mean matching are considered. Alternatively stated, the offset and fluctuation of the raw data of the chambers are used for identifying the target chamber. Moreover, before executing the sigma matching process and the mean matching process for the raw data of the chambers, noises in the raw data of the chambers are determined and are filtered if they exist. Accordingly, accuracy of the determination of the target chamber is increased and error is decreased.

In operation S203, in the condition that the number of the chambers is equal to or less than the predetermined number (e.g., two, in some embodiments), operations S221-S237 are executed, as illustrated in FIG. 2B. For illustration of operations S221-S237, chambers CH6 and CH7 and virtual chambers CH8 and CH9 are described for detailed explanation.

In operation S221, one of the chambers CH6 and CH7 is configured to become the virtual chambers CH8 and CH9 by the control unit 150. For illustration, the chamber CH6 is configured to become the virtual chambers CH8 and CH9, in which each one of the virtual chambers CH8 and CH9 includes a part of the raw data of the chamber CH6.

In some embodiments, the operation of configuring the chamber is based on a sampling size for wafer counts. For example, if a chamber has 70 wafer counts and the sampling size is 30, then the chamber is configured to become three virtual chambers, in which two of the virtual chambers both have 30 wafer counts and another one of the virtual chamber has 10 wafer counts. In some other embodiments, the operation of configuring the chamber to become virtual chambers is based on a sampling period. For example, a total period of receiving the raw data of the chamber is one hour and a sampling period is 40 minutes. In such an example, the chamber is configuring to become two virtual chambers by the control unit 150, in which one of the virtual chambers includes the raw data within a previous 40 minutes while the other one includes the raw data within a later 20 minutes of the raw data of the chamber.

In operation S223, the sigma values σ6-σ9 respectively corresponding to the chambers CH6-CH7 and the virtual chambers CH8-CH9 are generated by the computing unit 130 based on the raw data of each of the chambers CH6-CH7 and the virtual chambers CH8-CH9. In some embodiments, the computing unit 130 calculates a standard deviation for the raw data of each of the chambers CH6-CH7 and the virtual chambers CH8-CH9, in order to generate the sigma values σ6-σ9 corresponding to the chambers CH6-CH7 and the virtual chambers CH8-CH9, respectively.

In operation S225, a determination is made by the control unit 150 to determine whether a sigma ratio corresponding to the sigma values σ6-σ7 is smaller than a threshold value. In some embodiments, a sigma ratio is a ratio of the square of a largest sigma value to the square of a smallest sigma value among the sigma values σ6-σ7 of the chambers CH6 and CH7.

In a condition that the sigma ratio is smaller than the threshold value, operation S227 is executed. In operation S227, mean outlier indexes $OI_{mean1}6$-$OI_{mean1}9$ respectively corresponding to the chambers CH6-CH7 and the virtual chambers CH8-CH9 are generated by the control unit 150 by executing a mean matching process for the chambers CH6-CH7 and the virtual chambers CH8-CH9. Operation S227 is similar to operation S209, and thus it is not further detailed herein.

In operation S229, a target chamber is identified by the control unit 150 according to the mean outlier indexes $OI_{mean1}6$-$OI_{mean1}9$, in which the target chamber is a chamber having a worst mean outlier index among the chambers CH6 and CH7 and the virtual chambers CH8 and CH9. Specifically, the control unit 150 identifies that the chamber CH6 is a target chamber when one of the virtual chambers CH8-CH9 and the chamber CH6 has a worst mean outlier index among the chambers CH6-CH7 and the virtual chambers CH8-CH9, or identifies that the chamber CH7 is the target chamber when the chamber CH7 has the worst mean outlier index among the chambers CH6-CH7 and the virtual chambers CH8-CH9.

In some embodiments, the control unit 150 identifies the largest mean outlier index among the mean outlier indexes $OI_{mean1}6$-$OI_{mean1}9$ as the worst mean outlier index. Alternatively stated, the control unit 150 identifies that the chamber having the largest mean outlier index is the target chamber. In some other embodiments, the control unit 150 identifies the mean outlier index larger than a predetermined criterion among the mean outlier indexes as the worst mean outlier index. Alternatively stated, the control unit 150 identifies that the chamber having the mean outlier index larger than the predetermined criterion is the target chamber.

On the other hand, in a condition that the sigma ratio is larger than or equal to the threshold value, operation S231 is executed. In operation S231, a noise-filtering process is executed by the control unit 150 for the raw data of each of the chambers CH6-CH7 and the virtual chambers CH8-CH9. In some embodiments, the sigma ratio represents the fluctuation of the raw data of the chambers. Therefore, a condition that the sigma ratio is larger than or equal to the threshold represents that the fluctuation between the chambers is large. The further detail of operation S231 is similar to operation S213, and thus it is not further detailed herein.

After the noise-filtering process is executed, operation S233 is executed. In operation S233, sigma outlier indexes $OI_{sigma1}6$-$OI_{sigma1}9$ respectively corresponding to the chambers CH6-CH7 and the virtual chambers CH8-CH9 are generated by the control unit 150 by executing a sigma matching process for the chambers CH6-CH7 and the virtual chambers CH8-CH9. The further detail of operation S233 is similar to operation S215, and thus it is not further detailed herein.

In some embodiments, the sigma matching process is used for identifying fluctuation of the raw data of the chambers. Alternatively stated, the sigma outlier index of the chamber represents fluctuation of the raw data of the chamber compared with the raw data of other chambers. Therefore, the control unit 150 determines whether the chamber is a target chamber in accordance with the sigma outlier index of the chamber.

In operation S235, mean outlier indexes $OI_{mean2}6$-$OI_{mean2}9$ respectively corresponding to the chambers CH6-CH7 and the virtual chambers CH8-CH9 are generated by the control unit 150 by executing the mean matching process for the chambers CH6-CH7 and the virtual chambers CH8-CH9. The further detail of operation S235 is similar to operation S217, and thus it is not further detailed herein.

In operation S237, a target chamber is identified by the control unit 150 according to integrated outlier indexes $OI_{in}6$-$OI_{in}9$, in which the target chamber is a chamber having a worst integrated outlier index among the chambers CH6 and CH7 and the virtual chambers CH8 and CH9. In some embodiments, the integrated outlier index (e.g., $OI_{in}6$) is a sum of the mean outlier index (e.g., $OI_{mean2}6$) and the sigma outlier index (e.g., $OI_{sigma1}6$). The further detail of operation S237 is similar to operations S219 and S229, and thus it is not further detailed herein.

As discussed above, in the condition that the number of chambers is equal to or less than the predetermined number, the raw data of one of the chambers are virtually configured to become virtual chambers. Accordingly, the sigma matching process and the mean matching process are still able to be executed for the raw data of the chambers and the virtual chambers. As a result, utilizing the fault detection and classification method 200 still has good analysis result and accurate determination.

In some approaches, fault detection and classification (FDC) matching is realized by user knowledge and experience, to find a target chamber that is operated in an abnormal condition and/or has FDC mismatching parameters. Such approaches lack an index to demonstrate meaning of variations of parameters that chambers with processing tools present.

Compared to the aforementioned approaches, the fault detection and classification system 100 and/or method 200, as described above, is able to detect, by using index and criterion, if a fault operation exists in operations of the chambers. The fault detection and classification system 100 and/or method 200 are further able to identify the target chamber having fault operation, based on the index and criterion.

In some embodiments, the offset and the fluctuation of the raw data of the chambers are used for identifying and determining the target chamber. Moreover, before executing the sigma matching process and the mean matching process for the raw data of the chambers, noise in the raw data of the chambers is determined and filtered. Accordingly, accuracy of the determination of the target chamber is increased and error is decreased. Furthermore, the fault detection and classification system 100 and the fault detection and classification method 200 provided in the present disclosure are not limited in the number of the chambers.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a method is disclosed that includes operations outlined below. Raw data from a plurality of chambers is received. Based on received raw data of the chambers, if a fault exists in operations of the chambers is detected. The detecting includes at least one of operations outlined below. A plurality of sigma values respectively corresponding to the chambers is generated based on the raw data of the chambers. A determination is made to determine whether a sigma ratio corresponding to the sigma values is smaller than a threshold value. A plurality of mean outlier indexes respectively corresponding to the chambers is generated by executing a mean matching process for the chambers in a condition that the sigma ratio is smaller than the threshold value. One of the chambers, which has a worst first mean outlier index of the first mean outlier indexes, is identified as a target chamber having fault operation.

Also disclosed is a method that includes operations outlined below. Raw data from a first chamber and a second chamber is received. Based on received raw data of the chambers, if a fault exists in operations of the first chamber and the second chamber is detected. The detecting includes at least one of operations outlined below. The first chamber is configured to become a plurality of virtual chambers, in which each of the virtual chambers includes parts of the raw data of the first chamber. A first sigma value and a second sigma value respectively corresponding to the first chamber and the second chamber are generated based on the raw data of the first chamber and the second chamber. A determination is made to determine whether a sigma ratio corresponding to the first sigma value and the second sigma value is smaller than a threshold value. A plurality of mean outlier indexes respectively corresponding to the first chamber, the second chamber and the virtual chambers are generated by executing a mean matching process for the first chamber, the second chamber and the virtual chambers in a condition that the sigma ratio is smaller than the threshold value. The first chamber is identified as a target chamber having fault operation, when one of the virtual chambers and the first chamber has a worst mean outlier index of the first mean outlier indexes among the first chamber, the second chamber and the virtual chambers, and the second chamber is identified as the target chamber when the second chamber has a worst mean outlier index of the first mean outlier indexes among the first chamber, the second chamber and the virtual chambers.

Also disclosed is a system that includes a plurality of chambers and a host device. The host device is configured to receive raw data from the chambers, and based on received raw data, to determine a target fault chamber by at least one of: generating a plurality of first sigma values corresponding to the plurality of chambers; based on a sigma ratio corresponding to the plurality of first sigma values, generating a plurality of first mean outlier indexes corresponding to the plurality of chambers; and based on the plurality of first mean outlier indexes, identifying a target chamber having fault operation as the target fault chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving raw data from a plurality of chambers;
based on received raw data of the plurality of chambers, detecting if a fault exists in operations of the plurality of chambers, wherein the detecting comprises at least one of:
based on the received raw data of the plurality of chambers, generating a plurality of first sigma values corresponding to the plurality of chambers;
in a condition that a sigma ratio corresponding to the plurality of first sigma values is smaller than a threshold value, generating a plurality of first mean outlier indexes corresponding to the plurality of chambers by executing a mean matching process for the plurality of chambers; and
identifying that one of the plurality of chambers, which has a worst first mean outlier index of the plurality of first mean outlier indexes, is a target chamber having fault operation; and
sending, from a host device to the target chamber, updated configuration data based on the detected fault to modify the fault operation of the target chamber.

2. The method of claim 1, wherein generating the plurality of first sigma values comprises:
calculating a standard deviation for the raw data of the plurality of chambers.

3. The method of claim 1, wherein the sigma ratio is a ratio of a square of a largest sigma value to a square of a smallest sigma value among the plurality of first sigma values.

4. The method of claim 1, wherein the mean matching process comprises:
calculating a mean value for the raw data of each one of the plurality of chambers; and
comparing each mean value of the plurality of chambers with the other mean values, to generate the plurality of first mean outlier indexes corresponding to the plurality of chambers.

5. The method of claim 1, wherein the detecting further comprises at least one of:
in a condition that the sigma ratio is larger than or equal to the threshold value, executing a noise-filtering process for the raw data of the plurality of chambers;
after the noise-filtering process is executed, generating a plurality of sigma outlier indexes corresponding to the plurality of chambers by executing a sigma matching process for the plurality of chambers;
after the noise-filtering process is executed, generating a plurality of second mean outlier indexes corresponding to the plurality of chambers by executing the mean matching process for the plurality of chambers; and identifying that one of the plurality of chambers, which has a worst sum of the plurality of sigma outlier indexes and the plurality of second mean outlier indexes, is the target chamber.

6. The method of claim 5, wherein the noise-filtering process comprises:
determining that the raw data, larger than a boundary value, of each one of the plurality of chambers is noise; and
filtering the noise from the raw data of each one of the plurality of chambers.

7. The method of claim 5, wherein the sigma matching process comprises:
calculating a standard deviation for the raw data of the plurality of chambers to generate a plurality of second sigma values corresponding to the plurality of chambers; and
comparing each one of the plurality of second sigma values with the others of the plurality of second sigma values, to generate the plurality of sigma outlier indexes corresponding to the plurality of chambers.

8. The method of claim 5, wherein the mean matching process comprises:
calculating a mean value for the raw data of each one of the plurality of chambers; and
comparing each mean value of the plurality of chambers with the other mean values, to generate the plurality of second mean outlier indexes corresponding to the plurality of chambers.

9. A method comprising:
based on raw data received from a first chamber and a second chamber, detecting if a fault exists in operations of the first chamber and the second chamber, wherein the detecting comprises at least one of:
configuring the first chamber to become a plurality of virtual chambers, wherein each one of the plurality of virtual chambers comprises a part of the raw data of the first chamber;
based on the raw data of the first chamber and the second chamber, generating a first sigma value and a second sigma value respectively corresponding to the first chamber and the second chamber;
in a condition that a sigma ratio corresponding to the first sigma value and the second sigma value is smaller than a threshold value, generating a plurality of first mean outlier indexes respectively corresponding to the first chamber, the second chamber and the plurality of virtual chambers by executing a mean matching process for the first chamber, the second chamber and the plurality of virtual chambers; and
identifying that the first chamber is a target chamber having fault operation, when one of the plurality of virtual chambers and the first chamber has a worst first mean outlier index of the plurality of first mean outlier indexes among the first chamber, the second chamber and the plurality of virtual chambers; and
sending, from a host device to the target chamber, updated configuration data based on the detected fault to modify the fault operation of the target chamber.

10. The method of claim 9, wherein generating the first sigma value and the second sigma value comprises:
calculating a standard deviation for the raw data of the first chamber and the second chamber, to generate the first sigma value and the second sigma value.

11. The method of claim 9, wherein the sigma ratio is a ratio of a square of a largest sigma value to a square of a smallest sigma value among the first sigma value and the second sigma value.

12. The method of claim 9, wherein the mean matching process comprises:
calculating a mean value for the raw data of each one of the first chamber, the second chamber and the plurality of virtual chambers; and
comparing each mean value of the first chamber, the second chamber and the plurality of virtual chambers with the other mean values, to generate the plurality of first mean outlier indexes respectively corresponding to the first chamber, the second chamber and the plurality of virtual chambers.

13. The method of claim 9, wherein the detecting further comprises at least one of:
in a condition that the sigma ratio is larger than or equal to the threshold value, executing a noise-filtering process for the raw data of each one of the first chamber, the second chamber and the plurality of virtual chambers;
after the noise-filtering process is executed, generating a plurality of sigma outlier indexes respectively corresponding to the first chamber, the second chamber and the plurality of virtual chambers by executing a sigma matching process for the first chamber, the second chamber and the plurality of virtual chambers;
after the noise-filtering process is executed, generating a plurality of second mean outlier indexes respectively corresponding to the first chamber, the second chamber and the plurality of virtual chambers by executing the mean matching process for the first chamber, the second chamber and the plurality of virtual chambers; and
identifying that the first chamber is the target chamber when one of the plurality of virtual chambers and the first chamber has a worst sum of the plurality of sigma outlier indexes and the plurality of second mean outlier indexes among the first chamber, the second chamber and the plurality of virtual chambers, and identifying that the second chamber is the target chamber when the second chamber has the worst sum of the plurality of sigma outlier indexes and the plurality of second mean outlier indexes among the first chamber, the second chamber and the plurality of virtual chambers.

14. The method of claim 13, wherein the noise-filtering process comprises:
determining that the raw data, larger than a boundary value, of each one of the first chamber, the second chamber and the plurality of virtual chambers is noise; and
filtering the noise from the raw data of each one of the first chamber, the second chamber and the plurality of virtual chambers.

15. The method of claim 13, wherein the sigma matching process comprises:
calculating a standard deviation for the raw data of each one of the first chamber, the second chamber and the plurality of virtual chambers, to generate a plurality of third sigma values respectively corresponding to the first chamber, the second chamber and the plurality of virtual chambers; and
comparing each one of the plurality of third sigma values with the other plurality of third sigma values, to generate the plurality of sigma outlier indexes respectively corresponding to the first chamber, the second chamber and the plurality of virtual chambers.

16. The method of claim 13, wherein the mean matching process comprises:
calculating a mean value for the raw data of each one of the first chamber, the second chamber and the plurality of virtual chambers; and
comparing each mean value of the first chamber, the second chamber and the plurality of virtual chambers with the other mean values, to generate the plurality of second mean outlier indexes respectively corresponding to the first chamber, the second chamber and the plurality of virtual chambers.

17. A system comprising:
a plurality of chambers; and
a host device configured:
to receive raw data from the plurality of chambers, and
based on received raw data, to detect if a target fault chamber exists in the plurality of chambers by at least one of:
generating a plurality of first sigma values corresponding to the plurality of chambers;
based on a sigma ratio corresponding to the plurality of first sigma values, generating a plurality of first mean outlier indexes corresponding to the plurality of chambers; and
based on the plurality of first mean outlier indexes, identifying a target chamber having fault operation as the target fault chamber; and
if the target fault chamber exists, to modify the fault operation of the target chamber by sending updated configuration data to the target fault chamber.

18. The system of claim 17, wherein the sigma ratio is a ratio of a square of a largest first sigma value to a square of a smallest first sigma value among the plurality of first sigma values.

19. The system of claim 17, wherein in a condition that the sigma ratio is larger than or equal to a threshold value, the host device is configured to execute a noise-filtering process for the raw data of the plurality of chambers.

20. The system of claim 19, wherein the host device is configured to detect if a target fault chamber exists in the plurality of chambers further by at least one of:
after the noise-filtering process is executed, generating a plurality of sigma outlier indexes corresponding to the plurality of chambers;
based on second mean values corresponding to the raw data, generating a plurality of second mean outlier indexes corresponding to the plurality of chambers; and
based on the plurality of sigma outlier indexes and the plurality of second mean outlier indexes, identifying a target chamber having fault operation as the target fault chamber.

* * * * *